(12) United States Patent
Madsen et al.

(10) Patent No.: US 11,340,791 B2
(45) Date of Patent: May 24, 2022

(54) APPARATUS AND METHOD FOR HANDLING DELIVERY OF DATA FROM A SOURCE TO ONE OR MORE DESTINATIONS

(71) Applicant: Arm Limited, Cambridge (GB)

(72) Inventors: David Madsen, Chandler, AZ (US); Richard F Bryant, Chandler, AZ (US)

(73) Assignee: Arm Limited, Cambridge (GB)

( * ) Notice: Subject to any disclaimer, the term of this patent is extended or adjusted under 35 U.S.C. 154(b) by 123 days.

(21) Appl. No.: 16/742,063

(22) Filed: Jan. 14, 2020

(65) Prior Publication Data

US 2021/0218401 A1 Jul. 15, 2021

(51) Int. Cl.
*G06F 3/06* (2006.01)
(52) U.S. Cl.
CPC .......... *G06F 3/0611* (2013.01); *G06F 3/0659* (2013.01); *G06F 3/0673* (2013.01)
(58) Field of Classification Search
CPC ..... G06F 3/0611; G06F 3/0659; G06F 3/0673
See application file for complete search history.

(56) References Cited

U.S. PATENT DOCUMENTS

| | | | |
|---|---|---|---|
| 9,038,073 B2* | 5/2015 | Kohlenz | G06F 9/5044 718/100 |
| 2018/0143905 A1* | 5/2018 | Roberts | G06F 12/0822 |
| 2018/0188952 A1* | 7/2018 | Carlton | G06F 3/061 |

* cited by examiner

*Primary Examiner* — William E. Baughman
*Assistant Examiner* — Janice M. Girouard
(74) *Attorney, Agent, or Firm* — Nixon & Vanderhye P.C.

(57) ABSTRACT

Apparatus comprises source circuitry to provide data items; buffer circuitry having a set of buffer entries to hold one or more data items, provided by the source circuitry, for delivery to one or more destinations within a respective delivery latency, in which a buffer entry holding an initial data item becomes available to hold another data item in response to delivery of the initial data item to its respective destination; and control circuitry to control acceptance of data items from the source circuitry for holding by the buffer circuitry, the control circuitry being configured to control the buffer circuitry to accept a given data item when: (i) a buffer entry is available to hold the given data item and (ii) the delivery latency of data items including the given data item held by the buffer circuitry is such that at least a threshold number of buffer entries may be made available within no more than a threshold availability period.

20 Claims, 6 Drawing Sheets

APPARATUS AND METHOD FOR HANDLING DELIVERY OF DATA FROM A SOURCE TO ONE OR MORE DESTINATIONS

BACKGROUND

This disclosure relates to apparatus and methods.

In some example data handling apparatus, buffer circuitry is provided between a source of data items and a set of destinations or endpoints. For example, the source of data items could be a processing element and the destinations could include, for example, a main memory, a cache memory, a so-called tightly coupled memory or the like. In some examples the buffer circuitry may be referred to as a store buffer.

Such a store buffer may be used to hold data items for delivery to the destinations. For example, multiple data items can be assembled in the store buffer into a single cache line or other coordinated access to a cache memory. In another example, data items can be held while a cache line is allocated to the cache memory.

Tightly coupled memory (TCM) is a term used to describe a dedicated memory connected to a processing element but not via a system bus or similar arrangement, so avoiding variable latency (for example because of bus arbitration schemes) applicable to accesses via the system bus. A perceived advantage of a TCM is therefore not only a low latency compared to other areas of memory but also the fact that the latency can be deterministic, which is to say that it is known in advance and is not dependent upon other run-time factors. TCM is therefore suitable for use with time-critical code execution, for example interrupt service routines and other time-critical control loops, particularly in so-called real time applications such as data handling apparatus controlling automotive or other safety-related functions.

A shared store buffer arrangement can provide an efficient use of storage, which is to say that a common store buffer is used to hold data items for delivery to multiple destinations. Given that the store buffer lies in the data delivery path to the TCM, in order to ensure that there are sufficient store buffer entries to allow for deterministic latency writing to the TCM, a reservation scheme is generally used so as to reserve some store buffer entries for TCM accesses. This is required because if the store buffer was full of data items for delivery to high-latency destinations, it could then be impossible to service (for example) an interrupt routine or other event requiring a set of deterministic latency TCM writes.

Similar principles can be applicable to other arrangements in which a source provides data items for buffering before delivery to different destinations. For example, instead of a store buffer, similar principles could apply to (say) a system bus controller configured to route data items to different destinations and being subject to a responsiveness requirement for some types of access.

SUMMARY

In an example arrangement there is provided apparatus comprising:
source circuitry to provide data items;
buffer circuitry having a set of buffer entries to hold one or more data items, provided by the source circuitry, for delivery to one or more destinations within a respective delivery latency, in which a buffer entry holding an initial data item becomes available to hold another data item in response to delivery of the initial data item to its respective destination; and
control circuitry to control acceptance of data items from the source circuitry for holding by the buffer circuitry, the control circuitry being configured to control the buffer circuitry to accept a given data item when: (i) a buffer entry is available to hold the given data item and (ii) the delivery latency of data items including the given data item held by the buffer circuitry is such that at least a threshold number of buffer entries may be made available within no more than a threshold availability period.

In another example embodiment there is provided apparatus comprising:
source means to provide data items;
buffer means having a set of buffer entries to hold one or more data items, provided by the source means, for delivery to one or more destinations within a respective delivery latency, in which a buffer entry holding an initial data item becomes available to hold another data item in response to delivery of the initial data item to its respective destination; and
control means for controlling acceptance of data items from the source means for holding by the buffer circuitry, the control means being operable to control the buffer means to accept a given data item when: (i) a buffer entry is available to hold the given data item and (ii) the delivery latency of data items including the given data item held by the buffer means is such that at least a threshold number of buffer entries may be made available within no more than a threshold availability period.

In another example embodiment there is provided a method comprising:
providing data items;
holding one of more data items provided by the providing step in a set of buffer entries;
delivering held data items to one or more destinations within a respective delivery latency and making available a buffer entry holding an initial data item to hold another data item in response to delivery of the initial data item to its respective destination; and
controlling acceptance of data items for holding, the controlling step comprising controlling acceptance of a given data item when: (i) a buffer entry is available to hold the given data item and (ii) the delivery latency of held data items including the given data item is such that at least a threshold number of buffer entries may be made available within no more than a threshold availability period.

Further respective aspects and features of the present technology are defined by the appended claims.

BRIEF DESCRIPTION OF THE DRAWINGS

The present technique will be described further, by way of example only, with reference to embodiments thereof as illustrated in the accompanying drawings, in which.

DESCRIPTION OF EMBODIMENTS

Figure 1:
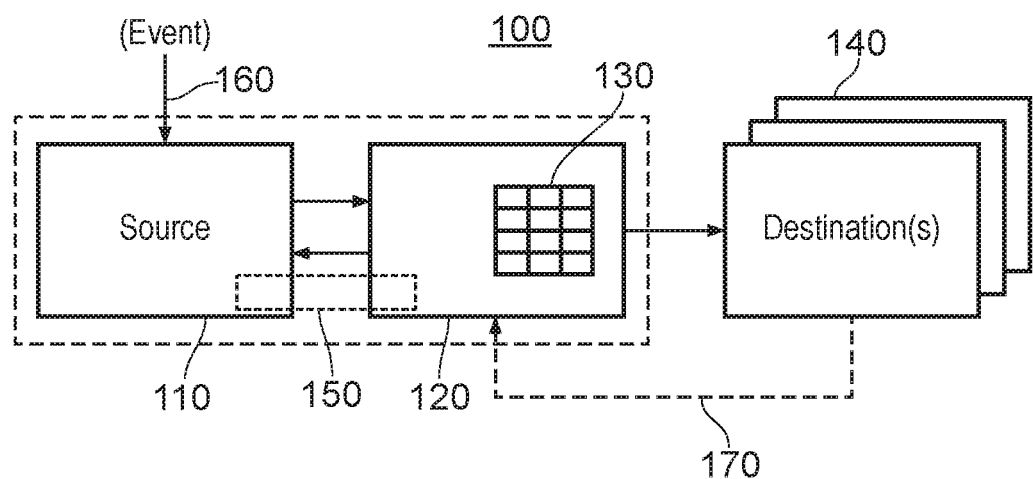
FIG. 1 schematically illustrates an example of data handling apparatus.

Before discussing the embodiments with reference to the accompanying figures, the following description of embodiments is provided.

An example embodiment provides apparatus comprising:
source circuitry to provide data items;
buffer circuitry having a set of buffer entries to hold one or more data items, provided by the source circuitry, for delivery to one or more destinations within a respective delivery latency, in which a buffer entry holding an initial data item becomes available to hold another data item in response to delivery of the initial data item to its respective destination; and
control circuitry to control acceptance of data items from the source circuitry for holding by the buffer circuitry, the control circuitry being configured to control the buffer circuitry to accept a given data item when: (i) a buffer entry is available to hold the given data item and (ii) the delivery latency of data items including the given data item held by the buffer circuitry is such that at least a threshold number of buffer entries may be made available within no more than a threshold availability period.

The disclosure recognises that a reservation scheme, in which a set of buffer entries are reserved purely for TCM accesses in case they are needed by an interrupt handler or other event, can be inefficient and indeed can negate some of the benefit of having a shared buffer arrangement because the buffer is effectively partitioned into separately functioning buffers. Given that in at least some embodiments, a non-acceptance of a data item by the buffer can lead to a stall (and/or initiation of a retry) or at least a delay in operations by the source circuitry (in other words, the source circuitry may stall and/or initiate a retry of the provision of a data item in response to that data item not being accepted by the buffer circuitry), there is a potential benefit in providing a more efficient use of the buffer circuitry in this type of arrangement.

Instead, in embodiments of the disclosure, entries in the buffer circuitry are tracked according to the expected or associated latency to deliver or "drain" the entry, so that buffer circuitry use is subject to a different constraint. Rather than reserving a particular number of entries for TCM accesses, a condition for accepting a new data item is applied so that the delivery latency of data items including the given data item held by the buffer circuitry is such that at least a threshold number of buffer entries may be made available within no more than a threshold availability period. For example, the threshold availability period may be a period, following initiation of an event such as initiation of an interrupt, by which access will be required to the TCM. Therefore, as long as the data items currently held in the buffer circuitry can be drained or delivered in time to provide enough clear entries to service the interrupt or other event, more use can be made of the buffer circuitry than in the simple reservation scheme discussed above.

Therefore, any (or potentially all) of the buffer entries may be occupied at any time with no need for a strict reservation scheme, subject only to the constraint defined above. This can allow for a more efficient use of the buffer circuitry.

In example embodiments the control circuitry is configured to control the buffer circuitry not to accept the given data item when a buffer entry is not available to hold the given data item. Similarly, in example embodiments the control circuitry is configured to control the buffer circuitry not to accept the given data item when the delivery latency of data items including the given data item held by the buffer circuitry is such that fewer than the threshold number of buffer entries may be made available within no more than a threshold availability period. However, the control circuitry may be configured to control the buffer circuitry to accept the given data item when at least the threshold number of buffer entries are available or are holding data items having a delivery latency of no more than the threshold availability period.

As mentioned above, in example embodiments the one or more destinations comprise respective data handling circuitry; and the source circuitry comprises a processing element to provide data items. Note that although example arrangements are particularly suited for use with a set of two or more destinations having potentially different respective latency characteristics, the disclosure is suitable in principle for use with a single destination where data items for delivery to that destination can be associated with different respective delivery latencies.

In some examples the processing element is responsive to a processing event (such as handling of a processor interrupt, or handling of a processor exception) to generate a set of one or more data items for provision to the buffer circuitry and to initiate delivery of one or more data items from the buffer circuitry so as to make available a number of buffer entries at least sufficient to hold the set of one or more data items. This can allow for the reliable handling of such an event with a deterministic latency to deliver data items generated by such an event, but without the need to reserve a portion of the buffer circuitry for use in case such an event occurs. In some examples, the processing element may be responsive to the processing event to generate the set of one or more data items for provision to the buffer circuitry within a predetermined event response period. For example, in order to avoid any impact to the event-handling operation of the processing element, the threshold availability period may be no longer than the predetermined event response period.

In example embodiments, each data item is associated with routing information defining a respective destination; and the control circuitry is configured to detect the delivery latency associated with a data item in response to the routing information associated with that data item. For example, each data handling circuitry may be mapped to a memory address range in a memory address space; and the routing information may comprise a memory address.

In example arrangements at least one of the destinations comprises memory circuitry. For example, in embodiments of the disclosure at least one of the destinations comprises system memory circuitry, in which data communication between the buffer circuitry and the system memory circuitry is via a data connection including at least a system bus; and at least one of the destinations comprises tightly coupled memory circuitry, in which data communication between the buffer circuitry and the tightly coupled memory circuitry is via a data connection not including the system bus; in which the delivery latency of a data item for delivery to the system memory circuitry is greater than the delivery latency of a data item for delivery to the tightly coupled memory circuitry.

In example arrangements at least one of the destinations comprises cache memory circuitry; and the control circuitry is responsive to an indication, by the cache memory circuitry, of whether the memory address of a data item is currently allocated for storage by the cache memory circuitry; in which the delivery latency of a data item for delivery to the cache memory circuitry is lower when the memory address of a data item is currently allocated for storage by the cache memory circuitry than when the memory address of a data item is not currently allocated for storage by the cache memory circuitry.

The assessment of delivery latency need not be fixed at a particular time or stage in the processing. For example the control circuitry may be configured to change the delivery latency associated with a data item for delivery to the cache memory circuitry in response to an indication from the cache memory circuitry of a change in the allocation of the memory address of that data item.

As discussed above, the buffer circuitry may comprise store buffer circuitry disposed between the processing element and the one or more destinations. The control circuitry may comprise control circuitry associated with the buffer circuitry and/or the processing element.

Another example embodiment provides apparatus comprising:

source means to provide data items;

buffer means having a set of buffer entries to hold one or more data items, provided by the source means, for delivery to one or more destinations within a respective delivery latency, in which a buffer entry holding an initial data item becomes available to hold another data item in response to delivery of the initial data item to its respective destination; and control means for controlling acceptance of data items from the source means for holding by the buffer circuitry, the control means being operable to control the buffer means to accept a given data item when: (i) a buffer entry is available to hold the given data item and (ii) the delivery latency of data items including the given data item held by the buffer means is such that at least a threshold number of buffer entries may be made available within no more than a threshold availability period.

Another example embodiment provides a method comprising:

providing data items;

holding one of more data items provided by the providing step in a set of buffer entries;

delivering held data items to one or more destinations within a respective delivery latency and making available a buffer entry holding an initial data item to hold another data item in response to delivery of the initial data item to its respective destination; and controlling acceptance of data items for holding, the controlling step comprising controlling acceptance of a given data item when: (i) a buffer entry is available to hold the given data item and (ii) the delivery latency of held data items including the given data item is such that at least a threshold number of buffer entries may be made available within no more than a threshold availability period.

Overview of Apparatus

Referring now to the drawings, FIG. 1 provide an overview of apparatus 100 comprising: source circuitry 110 to provide data items; buffer circuitry 120 having a set 130 of buffer entries to hold one or more data items, provided by the source circuitry, for delivery to one or more destinations or endpoints 140 within a respective delivery latency, in which a buffer entry holding an initial data item becomes available to hold another data item in response to delivery of the initial data item to its respective destination; and control circuitry 150 (shown schematically as overlapping the source circuitry and the buffer circuitry to illustrate that it can be implemented by one or both of these circuitries or indeed as stand-alone circuitry) to control acceptance of data items from the source circuitry for holding by the buffer circuitry, the control circuitry being configured to control the buffer circuitry to accept a given data item when: (i) a buffer entry is available to hold the given data item and (ii) the delivery latency of data items including the given data item held by the buffer circuitry is such that at least a threshold number of buffer entries may be made available within no more than a threshold availability period.

The source circuitry 100 may be responsive to an event signal 160 or other processing event initiation such as initiation of an interrupt or the like. The destination(s) 140 may provide information 170 and back to the buffer circuitry 120 and/or the control circuitry 150 to indicate a current or prevailing latency status applicable to one or more of the held data items.

In various examples to be discussed below, the source circuitry 100 is a processing element, the destination(s) 140 may be different types of data storage such as memories and the buffer circuitry 120 may be a store buffer. However, the present techniques are more widely applicable and can be applied to any situation in which data items from a particular source are held before being delivered to one or more destination(s) having different or variable delivery latencies. For example, the buffer circuitry 120 may be provided at or in association with a system bus controller or the like.

Having said this, a specific example will be described with reference to FIG. 2.

SoC Example

Figure 2:
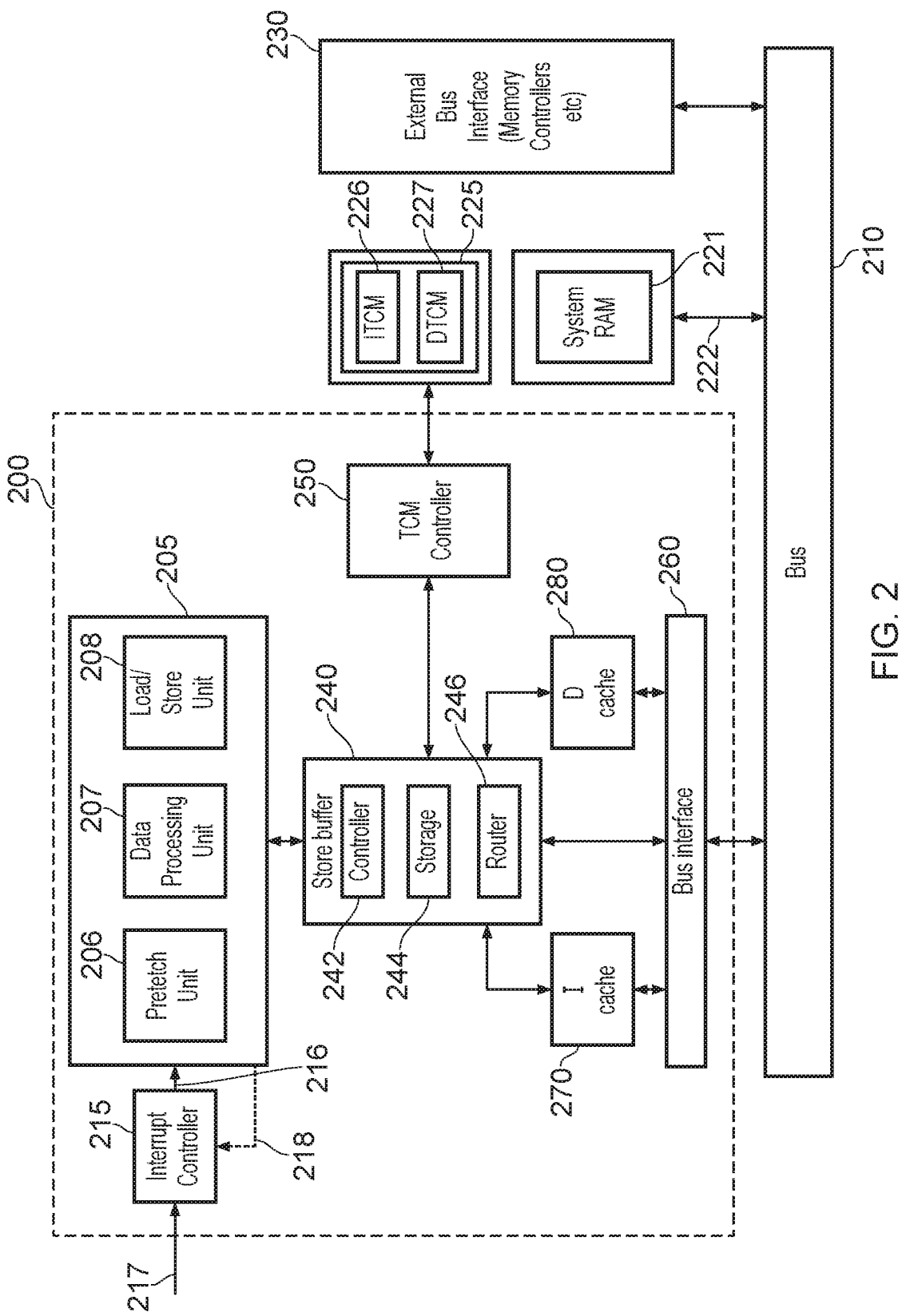
FIG. 2 is a more detailed illustration of an example of data handling apparatus.

In FIG. 2, a so-called system-on-ship (SoC) 200 includes a processing element 205 connected via a system bus 210 to a system RAM or memory 221 and to an external bus interface 230 connectable to one or more memory controllers, peripheral devices or the like. A so-called tightly coupled memory (TCM) 225 is also accessible by the processing element 205.

The system RAM 221 and the TCM 220 may be implemented separately, as shown in the schematic representation of FIG. 2, or may in some examples (not shown) be implemented as respective portions of a so-called multi-port SRAM or memory.

The processing element 205 may typically comprise circuitry providing functions such as those of a pre-fetch unit 206, a data processing unit 207 and a load/store unit 208. The functionality of the event initiation 160 of FIG. 1 may be provided by an interrupt controller 215 issuing a control signal 216, for example in response to an external (at least from the point of view of the SoC) interrupt signal 217. Alternatively, the interrupt controller 215 may generate the interrupt signal 216 in response to information 218 indicative of a current state or event relating to operation of the processing element 205.

The system RAM 221 and the TCM 225 together provide various portions of storage which may be defined at least in part by respective memory address ranges within an applicable memory address space. The system RAM 221 is accessible via a connection 222 to the system bus 210.

The TCM) 225 may in turn be partitioned as an instruction TCM (ITCM) 226 and a data TCM (DTCM) 227. In the present context, any items for writing to the TCM (whether to the ITCM or to the DTCM) are referred to generically as "data items".

The TCM differs from the system RAM in that it is accessible directly by the processing element 205, which is to say not via the system bus 210. Instead, a data communication route from the processing element 205 to the TCM 225 (that is to say, for writing of data items) is via a store buffer 240 and a TCM controller 250. A data communication path from the TCM 225 to the processing element 205 (that is to say, for reading of data items) follows a similar route but unlike the write path, data items retrieved from the TCM are not buffered by the store buffer 240.

In this way, the TCM 225 provides an example of a dedicated memory connected directly to the processing element 205 but not via a bus so as to avoid arbitration and indeterminate latencies for frequently executed or time-critical code. In examples, the ITCM 226 may store, for example, critical code, interrupt service routines or the like. The DTCM 227 may store frequently used data, stack and/or heap data, digital signal processing coefficients or the like. In a typical implementation, the DTCM may be somewhat larger (for example, eight times larger) than the ITCM, although the absolute and relative sizes of the portions of the TCM (and indeed whether the TCM is partitioned between instructions and data) are a matter of design choice.

The store buffer 240 comprises a controller 242, buffer storage 244 (to implement the set of buffer entries mentioned above) and a data item router 246. A data item held by the store buffer 240 may be routed to a respective one of various different potential destinations corresponding to the destinations 140 of FIG. 1. In FIG. 2, these include: the TCM 225 via the TCM controller 250; the system RAM 221 via a bus interface 260, the bus 210 and the connection 222; an instruction cache (I-cache) 270; a data cache (D-cache) 280; and one or more devices connected via the external bus interface 230. Generally speaking, the router 246 is configured to route a data item according to a memory address and/or other attribute associated with that data item.

As mentioned above, the controller 242 may be implemented by functionality of the store buffer 240 and/or of the processing element 205 or as a separate unit. For convenience, it is shown in FIG. 2 as being implemented by part of the functionality of the store buffer 240.

Therefore, in the example of FIG. 2, the one or more destinations comprise respective data handling circuitry; and the source circuitry comprises a processing element to provide data items. In FIG. 2, at least one of the destinations comprises memory circuitry. In particular in FIG. 2, at least one of the destinations comprises system memory circuitry, in which data communication between the buffer circuitry and the system memory circuitry is via a data connection including at least a system bus; and at least one of the destinations comprises tightly coupled memory circuitry, in which data communication between the buffer circuitry and the tightly coupled memory circuitry is via a data connection not including the system bus; in which the delivery latency of a data item for delivery to the system memory circuitry is greater than the delivery latency of a data item for delivery to the tightly coupled memory circuitry.

Similarly in FIG. 2, at least one of the destinations comprises cache memory circuitry; and the control circuitry is responsive to an indication, by the cache memory circuitry, of whether the memory address of a data item is currently allocated for storage by the cache memory circuitry; in which the delivery latency of a data item for delivery to the cache memory circuitry is lower when the memory address of a data item is currently allocated for storage by the cache memory circuitry than when the memory address of a data item is not currently allocated for storage by the cache memory circuitry.

Store Buffer

Figure 3:
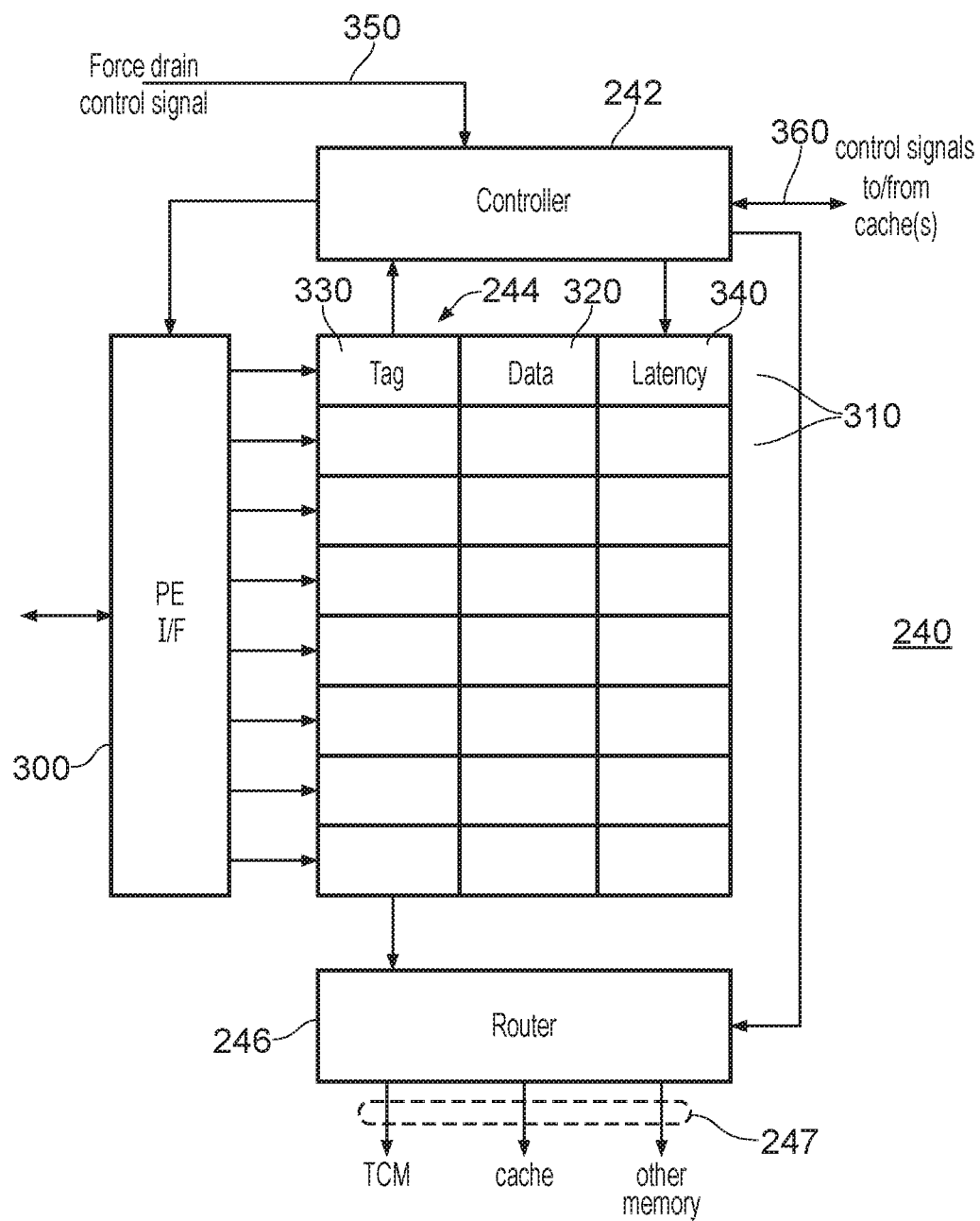
FIG. 3 schematically illustrates an example store buffer.

Referring to FIG. 3, further detail relating to the store buffer 240 is shown in schematic form. In the examples, the buffer circuitry comprises store buffer circuitry disposed between the processing element and the one or more destinations, and the control circuitry comprises control circuitry associated with the buffer circuitry and/or the processing element.

In FIG. 3, data item routing is shown in relation to write operations in which data items to be delivered to the one or more destinations are held prior to delivery by the store buffer 240. Read operations do not involve the data items being held by the store buffer 240 and so, for clarity of the diagram, data communication paths relating to such read operations are not shown.

A processing element interface 300 provides an interface for data items are received from the processing element 205 and also provides, under the control of the controller 242, a signal indicating whether or not the store buffer 240 is able to accept a data item to be provided by the processing element 205. In the case that the store buffer 240 is currently unable to accept such a data item, the processing element 205 does not provide the data item and indeed may stall or temporarily pause the provision of that data item (and/or initiate a retry of the provision of the data item, depending on how the processing element 205 is configured to handle such a non-acceptance) in response to that data item not being accepted by the store buffer 240. Whether or not the processing element 205 may continue with other processing activities while the provision of the non-accepted data item is stalled and/or retried is a matter of system design choice but in any event it is preferable, for efficient operation of the processing element 205, that as few data items are stalled and/or retried as possible, and particularly that the provision of data items relating to execution of time-critical or event-initiated code is not stalled/prompted to retry or is stalled/retried as little as possible.

Data items to be stored by the storage 244 are assigned to a respective entry 310 amongst the set of entries provided by the storage 244. This may for example be on a so-called fully-associative basis or another basis so that the process of assignment of a data item to a respective entry can make use of established techniques relating to buffer storage. The data item itself 320 may be associated with a so-called tag 330 indicative of at least part of its memory address and an indicator 340 to indicate a latency associated with the data item. The latency indicator 340 may be created and/or managed by the controller 242 using techniques to be discussed below. The latencies indicated by the prevailing values of the latency indicators for data items currently held by the store buffer are used by the controller 242 to determine whether or not to control the interface 300 to accept a next data item for storage. That decision can also be based (as discussed below with reference to FIG. 4) on an expected delivery latency associated with a newly provided data item.

The controller 242 also oversees the routing, by the router 246, of data items held by the storage 244. The data routes 247 from the router 246 to different endpoints or destinations are shown as existing separately (for schematic purposes) to illustrate the feature that routing to the various different endpoints could happen substantially simultaneously.

The controller 242 is responsive to a force drain control signal 350 which may be provided by the processing element 205 and/or the interrupt controller 215. The purpose and effect of the force drain control signal 350 will be discussed further below.

The controller 242 provides control signals 360 to, and receives control signals from, the cache memory or memories 270, 280. The purpose of these control signals is as follows.

When a data item held (or to be received from the processing element 205) by the store buffer 240 has a cache memory as its destination, the subsequent writing of that data item to the respective cache memory can depend upon a cache line relating to the address of the data item being present in (allocated to) the cache memory. Optionally, the subsequent writing can also be dependent upon other data items relating to the same cache line being provided to the store buffer 240 so that the store buffer 240 can assemble a more efficient data write operation by coalescing multiple data items into a single cache line write. But returning to the question of whether the cache line is currently allocated to the cache memory, in response to a data item being provided by the processing element 205 which requires writing to the cache memory, the controller 242 can issue a control signal 360 to the cache memory to request allocation of that line or confirmation that the line is already allocated. The cache memory may return a control signal 360 indicating an allocation state of the relevant line, noting that the allocation state could potentially change from "allocated" to "no longer allocated" in response to cache maintenance operations outside the control of the store buffer 240. For example, this could also happen as a result of natural evictions or replacements of lines in the cache due to other allocations.

The expected latency associated with a data item to be written to a cache memory is dependent upon the allocation status of the relevant cache line, as indicated to the controller 242 by a signal of the control signals 360. If the line is currently not allocated, the expected latency is "unknown" (but treated as potentially "long", for example having an expected latency of greater than the threshold availability period, in the context of the current operations). If the line is currently allocated, the expected latency may be significantly shorter and, more significantly in connection with the present techniques, may be deterministic (known), albeit that the controller 242 may, in the absence of requirements to drain the storage 244, control holding of that data item for a longer period, for example in order to assemble a more efficient cache write as discussed above.

Other information (as well as or instead of received control signals 360) may be used by the controller 242 to set and maintain the latency indicator 340 associated with each data item. In some examples, the latency indicator 340 may be dependent upon the type of memory or other device to which the data item is to be routed (which can as discussed above be detected from the memory address and/or other attribute of the data item). For example, data items to be delivered to TCM 225 may have a latency indicator 340 indicating a very short latency of perhaps one or two clock cycles. Data items for delivery to a cache memory may have a latency indicator 340 dependent upon not only the destination but also the current status of that destination as discussed above. Data items for delivery to other destinations can be associated with latency indicators 340 dependent upon one or both of the nature of that destination and the current status of that destination. The latency indicators are maintained according to any status information received relating to a destination by the controller 242.

Example Operations

Figure 4:
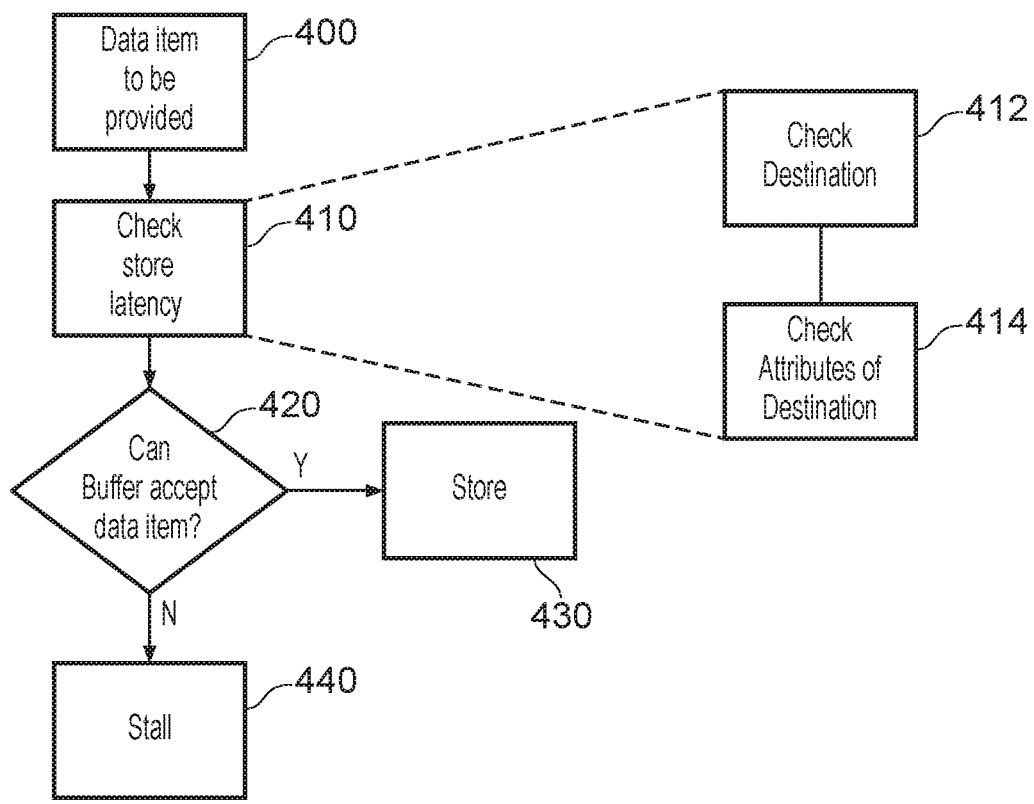
FIGS. 4 to 6 are schematic flowcharts illustrating respective methods.
Figures 5, 6:
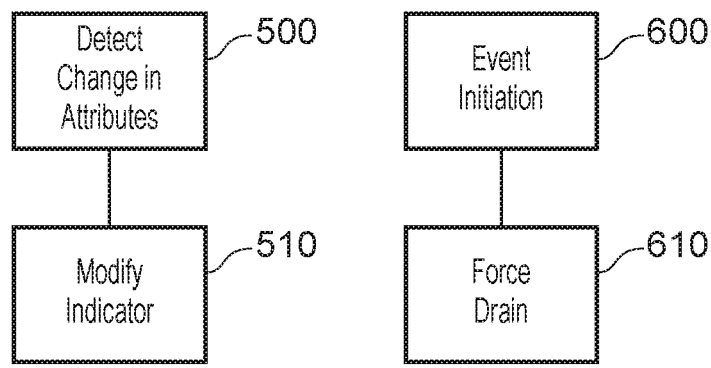

FIGS. 4 to 6 are schematic flowcharts illustrating respective methods, each relating to an aspect of the operation of the store buffer 240 and in particular of the controller 242.

FIG. 4 schematically represents operations associated with the provision (or at least attempted provision) of a data item by the source circuitry 110.

At a step 400, the source circuitry 110 (205) generates a data item to be provided to the buffer circuitry 120 (240) for subsequent delivery to a destination 140. At a step 410 the controller 150 (242) checks the expected latency associated with the data item to be provided. This can involve checking (at a step 412) the destination associated with the data item, for example by examination of the memory address and/or other attribute associated with the data item and mapping this to a respective destination, and potentially checking (at a step 414) prevailing attributes associated with the destination such as, for example, whether a relevant cache line is currently allocated as discussed above.

The step 410 therefore provides an example in which each data item is associated with routing information defining a respective destination; and the control circuitry is configured to detect the delivery latency associated with a data item in response to the routing information associated with that data item. For example, each data handling circuitry may be mapped to a memory address range in a memory address space; and the routing information may comprise a memory address.

Based on the results of the step 410 and on the current occupancy of the store buffer 240, the controller 242 determines at a step 420 whether or not the store buffer 240 can accept the data item, or in other words whether the availability constraint (as discussed below) would be met by the store buffer if the new data item were to be accepted. If the answer is yes then the data item is stored in a buffer entry at a step 430 and the prevailing expected latency is stored as the latency indicator 340 associated with that data item. If the answer is no then at a step 440 the data item is declined and processing, at least relating to the provision of a data item, is stalled and/or a retry of the process is initiated.

The step 420 involves accepting a given data item when: (i) a buffer entry is available to hold the given data item and (ii) the delivery latency of data items including the given data item held by the buffer circuitry is such that at least a threshold number of buffer entries may be made available within no more than a threshold availability period.

In other words, if the store buffer 240 is full, then at the step 420 the control circuitry is configured to control the buffer circuitry not to accept the given data item when a buffer entry is not available to hold the given data item.

Assuming the store buffer 240 is not currently full, then the question of whether the buffer can accept the data item at the step 420 involves a comparison of expected latency is as indicated by the indicators 340 and the latency for the new data item generated at the step 410. At the step 420, the control circuitry is configured to control the buffer circuitry not to accept the given data item when the delivery latency of data items including the given data item held by the buffer circuitry is such that fewer than the threshold number of buffer entries may be made available within no more than a threshold availability period. For example, in may be the situation for the particular SoC design in use that the handling of an interrupt or other time-critical event by the processing element 205 requires the ability to write (say) up to four data items to the TCM 225 no sooner than (say) five clock cycles after initiation of the interrupt or other time-critical event. Here, the "threshold number of buffer entries" referred to above would be four, which is to say the maximum number potentially required for the handling of the interrupt or other time-critical event. This threshold number would correspond to the size of a reservation in the store buffer in the previously proposed system discussed above. The "threshold availability period" refers to above would be, in this example, five clock cycles. This availability period relates to a period taken, after initiation of an interrupt or other time-critical event, for data items for storage to the TCM to be first generated.

So, in this example, the acceptance at the step 420 (assuming that the buffer is not full already) is dependent upon the situation, if the new data item is indeed accepted, being such that at least four (in this example) buffer entries could if necessary be made available within five (in this example) clock cycles of initiation of a particular event. This condition could be met, for example, if (after acceptance of the new data item) there remain four unoccupied buffer entries. Alternatively, the condition could be met, for example, if (after acceptance of the new data item) there remain fewer than four unoccupied buffer entries, but at least four buffer entries store data items having an expected delivery or drain latency which is sufficiently low that at least the four buffer entries could be made available within five clock cycles by forcing a drain of those entries (delivery to the respective destination(s)).

Similarly, at the step 420 the control circuitry is configured to control the buffer circuitry to accept the given data item when at least the threshold number of buffer entries are available or are holding data items having a delivery latency of no more than the threshold availability period.

FIG. 5 schematically illustrates example operations of the controller 242 in connection with, for example, a cache memory, in that at a step 500, the controller 242 detects a change in the prevailing properties or attributes of the cache memory, for example in connection with the allocation status of a cache line applicable to a data item held by the store buffer 240, and at a step 510 the controller 242 modifies (if appropriate) the indicator of expected latency associated with that data item.

Therefore FIG. 5 provides an example in which in which the control circuitry is configured to change the delivery latency associated with a data item for delivery to the cache memory circuitry in response to an indication from the cache memory circuitry of a change in the allocation of the memory address of that data item.

FIG. 6 schematically illustrates operations which may be associated with the initiation of a processing events such as the handling of an interrupt or the handling of a processing exception. At the step 600 the relevant event is initiated and at a step 610 the processing element 205 provides the force drain control signal 350 to the controller 242 which, in response, executes a forced drain operation to make available at least the threshold number of buffer entries within no more than the threshold availability period.

The flowchart of FIG. 6 therefore provides an example in which the processing element is responsive to a processing event to generate a set of one or more data items for provision to the buffer circuitry and to initiate delivery of one or more data items from the buffer circuitry so as to make available a number of buffer entries at least sufficient to hold the set of one or more data items.

Examples of Availability Periods

Figure 7:
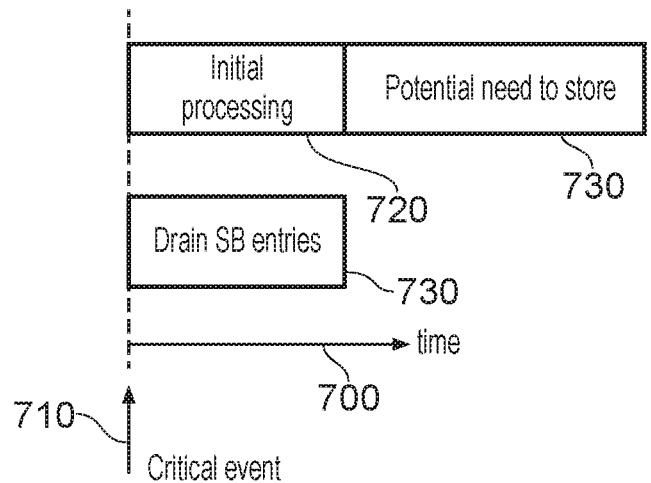
FIGS. 7 to 9 are schematic timing diagrams.
Figure 8:
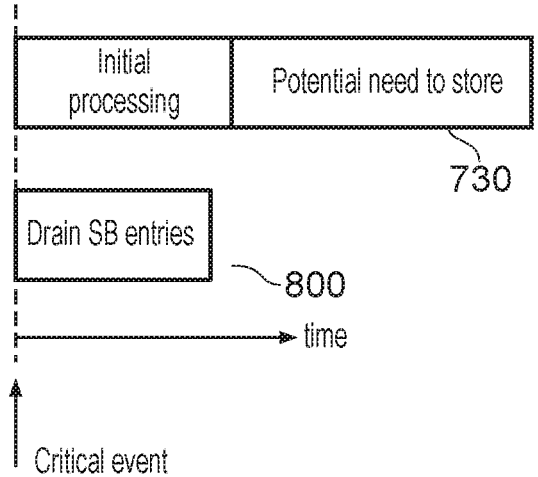
Figure 9:
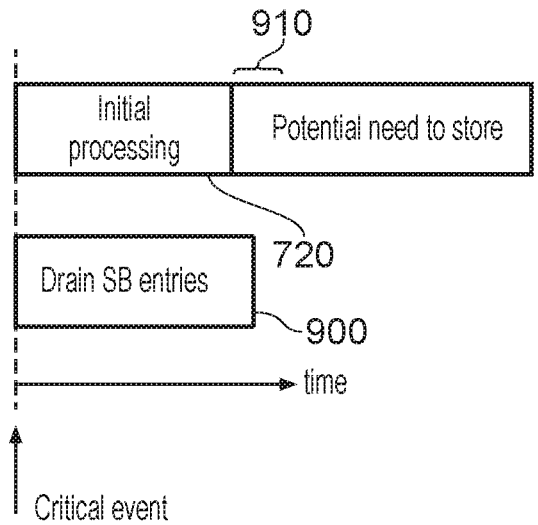

FIGS. 7-9 schematically illustrate examples of the threshold availability period discussed above.

In each of FIGS. 7-9, time is indicated in a horizontal direction by an arrow 700, with a critical event being initiated at a time 710. In each case, initial processing 720 relating to the critical event takes a particular period (which is the same in each of the examples of FIGS. 7-9) with the potential need to store data items to the TCM 730 occurring no earlier than the end of the initial processing period 720. The initial processing period 720 represents a predetermined event response period within which the processing element is responsive to the processing event to generate the set of one or more data items for provision to the buffer circuitry.

In FIG. 7, the threshold availability period is set to be the same as the length of the initial processing period 720 so that the required number of store buffer entries can be drained 730 if necessary during the same number of clock cycles as that taken by the initial processing.

In FIG. 8, the threshold availability period is set to be shorter than the length of the initial processing 720 so that the draining 800, where necessary, of store buffer entries is completed before the potential need to store data resulting from the critical event.

In FIGS. 7 and 8, therefore, the threshold availability period is no longer than the predetermined event response period.

In FIG. 9, the threshold availability period is set to be longer than the length of the initial processing 720. This means that potentially the draining 900 of store buffer entries may take longer than the initial processing. This could lead to an overlap period 910 during which processing is stalled and/or retry is initiated. In some situations this may be unacceptable (which would lead the design choices to implement one of FIG. 7 and FIG. 8) but in other situations a short and deterministic period of stalling/retrying may be deemed acceptable, particularly if the length of the initial processing period may be longer than that shown as the period 720.

SUMMARY METHOD

Figure 10:
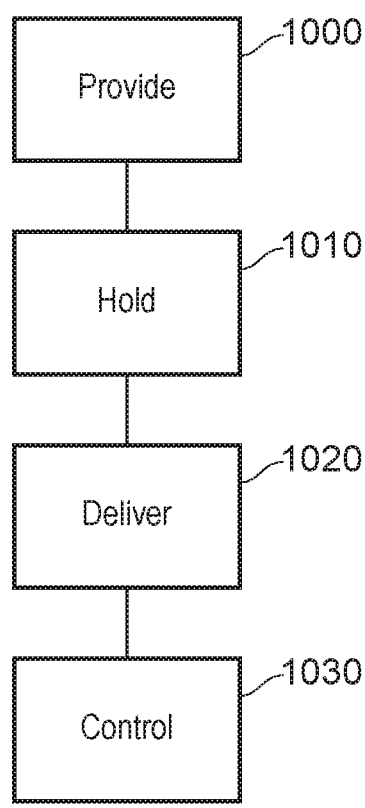
FIG. 10 is a schematic flowchart illustrating a method.

FIG. 10 is a schematic flowchart illustrating a method comprising:

providing (at a step 1000) data items;

holding (at a step 1010) one of more data items provided by the providing step in a set of buffer entries;

delivering (at a step 1020) held data items to one or more destinations within a respective delivery latency and making available a buffer entry holding an initial data item to hold another data item in response to delivery of the initial data item to its respective destination; and controlling (at a step 1030) acceptance of data items for holding, the controlling step comprising controlling acceptance of a given data item when: (i) a buffer entry is available to hold the given data item and (ii) the delivery latency of held data items including the given data item is such that at least a threshold number of buffer entries may be made available within no more than a threshold availability period.

The steps 1000-1030 may be performed by circuitry such as that shown in FIG. 1, for example.

In the present application, the words "configured to . . . " are used to mean that an element of an apparatus has a configuration able to carry out the defined operation. In this context, a "configuration" means an arrangement or manner of interconnection of hardware or software. For example, the apparatus may have dedicated hardware which provides the defined operation, or a processor or other processing device may be programmed to perform the function. "Configured to" does not imply that the apparatus element needs to be changed in any way in order to provide the defined operation.

Although illustrative embodiments of the present techniques have been described in detail herein with reference to the accompanying drawings, it is to be understood that the present techniques are not limited to those precise embodiments, and that various changes, additions and modifications can be effected therein by one skilled in the art without departing from the scope and spirit of the techniques as defined by the appended claims. For example, various combinations of the features of the dependent claims could be made with the features of the independent claims without departing from the scope of the present techniques.

The invention claimed is:

1. Apparatus comprising:
   source circuitry to provide data items;
   buffer circuitry having a set of buffer entries to hold one or more data items, provided by the source circuitry, for delivery to one or more destinations within a respective delivery latency, the respective delivery latency for each buffered data item being indicated by a latency indicator associated with that buffered data item, in which a buffer entry holding an initial data item becomes available to hold another data item in response to delivery of the initial data item to its respective destination; and
   control circuitry to control acceptance of data items from the source circuitry for holding by the buffer circuitry, the control circuitry being configured to control the buffer circuitry to accept a given data item when: (i) a buffer entry is available to hold the given data item and (ii) the delivery latency of each of the data items held by the buffer circuitry as indicated by the respective associated latency indicators and the delivery latency of the given data item is such that at least a threshold number of buffer entries may be made available within no more than a threshold availability period.

2. The apparatus of claim 1, in which the control circuitry is configured to control the buffer circuitry not to accept the given data item when a buffer entry is not available to hold the given data item.

3. The apparatus of claim 1, in which the control circuitry is configured to control the buffer circuitry not to accept the given data item when the delivery latency of data items including the given data item held by the buffer circuitry is such that fewer than the threshold number of buffer entries may be made available within no more than a threshold availability period.

4. The apparatus of claim 1, in which the control circuitry is configured to control the buffer circuitry to accept the given data item when at least the threshold number of buffer entries are available or are holding data items having a delivery latency of no more than the threshold availability period.

5. The apparatus of claim 1, in which:
   the one or more destinations comprise respective data handling circuitry; and
   the source circuitry comprises a processing element to provide data items.

6. The apparatus of claim 5, in which:
   the processing element is configured to stall and/or initiate a retry of the provision of a data item in response to that data item not being accepted by the buffer circuitry.

7. The apparatus of claim 5, in which:
   the processing element is responsive to a processing event to generate a set of one or more data items for provision to the buffer circuitry and to initiate delivery of one or more data items from the buffer circuitry so as to make available a number of buffer entries at least sufficient to hold the set of one or more data items.

8. The apparatus of claim 7, in which the processing event is an event selected from the list consisting of:
   (a) handling of a processor interrupt; and
   (b) handling of a processor exception.

9. The apparatus of claim 8, in which the processing element is responsive to the processing event to generate the set of one or more data items for provision to the buffer circuitry within a predetermined event response period.

10. The apparatus of claim 9, in which the threshold availability period is no longer than the predetermined event response period.

11. The apparatus of claim 5, in which:
    each data item is associated with routing information defining a respective destination; and
    the control circuitry is configured to detect the delivery latency associated with a data item in response to the routing information associated with that data item.

12. The apparatus of claim 11, in which:
    each data handling circuitry is mapped to a memory address range in a memory address space; and
    the routing information comprises a memory address.

13. The apparatus of claim 12, in which:
    at least one of the destinations comprises memory circuitry.

14. The apparatus of claim 13, in which:
    at least one of the destinations comprises system memory circuitry, in which data communication between the buffer circuitry and the system memory circuitry is via a data connection including at least a system bus; and
    at least one of the destinations comprises tightly coupled memory circuitry, in which data communication between the buffer circuitry and the tightly coupled memory circuitry is via a data connection not including the system bus;
    in which the delivery latency of a data item for delivery to the system memory circuitry is greater than the delivery latency of a data item for delivery to the tightly coupled memory circuitry.

15. The apparatus of claim 14, in which:
    at least one of the destinations comprises cache memory circuitry; and
    the control circuitry is responsive to an indication, by the cache memory circuitry, of whether the memory address of a data item is currently allocated for storage by the cache memory circuitry;
    in which the delivery latency of a data item for delivery to the cache memory circuitry is lower when the memory address of a data item is currently allocated for storage by the cache memory circuitry than when the memory address of a data item is not currently allocated for storage by the cache memory circuitry.

16. The apparatus of claim 15, in which the control circuitry is configured to change the delivery latency associated with a data item for delivery to the cache memory circuitry in response to an indication from the cache memory circuitry of a change in the allocation of the memory address of that data item.

17. The apparatus of claim 13, in which the buffer circuitry comprises store buffer circuitry disposed between the processing element and the one or more destinations.

18. The apparatus of claim 5, in which the control circuitry comprises control circuitry associated with the buffer circuitry and/or the processing element.

19. Apparatus comprising:
    source means to provide data items;
    buffer means having a set of buffer entries to hold one or more data items, provided by the source means, for delivery to one or more destinations within a respective delivery latency, the respective delivery latency for each buffered data item being indicated by a latency indicator associated with that buffered data item, in which a buffer entry holding an initial data item becomes available to hold another data item in response to delivery of the initial data item to its respective destination; and control means for controlling acceptance of data items from the source means for holding by the buffer circuitry, the control means being operable to control the buffer means to accept a given data item when: (i) a buffer entry is available to hold the given data item and (ii) the delivery latency of each of the data items held by the buffer means as indicated by the respective associated latency indicators and the delivery latency of the given data item is such that at least a threshold number of buffer entries may be made available within no more than a threshold availability period.

20. A method comprising:

providing data items;

holding one of more data items provided by the providing step in a set of buffer entries;

delivering held data items to one or more destinations within a respective delivery latency, the respective delivery latency for each held data item being indicated by a latency indicator associated with that buffered data item, and making available a buffer entry holding an initial data item to hold another data item in response to delivery of the initial data item to its respective destination; and controlling acceptance of data items for holding, the controlling comprising controlling acceptance of a given data item when: (i) a buffer entry is available to hold the given data item and (ii) the delivery latency of each of the held data items as indicated by the respective associated latency indicators and the delivery latency of the given data item is such that at least a threshold number of buffer entries may be made available within no more than a threshold availability period.

\* \* \* \* \*